(12) United States Patent
Poelzl

(10) Patent No.: US 9,660,047 B2
(45) Date of Patent: *May 23, 2017

(54) METHOD FOR FORMING SEMICONDUCTOR COMPONENTS HAVING SELF-ALIGNED TRENCH CONTACTS

(71) Applicant: Infineon Technologies Austria AG, Villach (AT)

(72) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/736,961

(22) Filed: Jun. 11, 2015

(65) Prior Publication Data

US 2015/0279962 A1 Oct. 1, 2015

Related U.S. Application Data

(63) Continuation of application No. 13/350,987, filed on Jan. 16, 2012, now Pat. No. 9,082,746.

(51) Int. Cl.

| H01L 21/332 | (2006.01) |
|---|---|
| H01L 29/66 | (2006.01) |
| H01L 29/40 | (2006.01) |
| H01L 29/423 | (2006.01) |
| H01L 29/739 | (2006.01) |

(Continued)

(52) U.S. Cl.
CPC .... *H01L 29/66348* (2013.01); *H01L 21/0337* (2013.01); *H01L 21/308* (2013.01); *H01L 21/31144* (2013.01); *H01L 21/76897* (2013.01); *H01L 29/0696* (2013.01); *H01L 29/1095* (2013.01); *H01L 29/401* (2013.01); *H01L 29/407* (2013.01); *H01L 29/41708* (2013.01); *H01L 29/4236* (2013.01); *H01L 29/6634* (2013.01); *H01L 29/66719* (2013.01); *H01L 29/66727* (2013.01); *H01L 29/66734* (2013.01); *H01L 29/7397* (2013.01); *H01L 29/7813* (2013.01); *H01L 29/41766* (2013.01)

(58) Field of Classification Search
CPC ..................................................... H01L 21/308
USPC ......................................................... 438/138
See application file for complete search history.

(56) References Cited

U.S. PATENT DOCUMENTS

| 6,500,755 B2 | 12/2002 | Dakshina-Murthy et al. |
|---|---|---|
| 6,916,745 B2 | 7/2005 | Herrick et al. |

(Continued)

*Primary Examiner* — Igwe U Anya
(74) *Attorney, Agent, or Firm* — Murphy, Bilak & Homiller, PLLC

(57) ABSTRACT

A method for producing a semiconductor component includes providing a semiconductor body having a first semiconductor material extending to a first surface and at least one trench, the at least one trench extending from the first surface into the semiconductor body, a first insulation layer being arranged in the at least one trench. The method further includes forming a second insulation layer on the first surface having a recess that overlaps in a projection onto the first surface with the at least one trench, forming a mask region in the recess, etching the second insulation layer selectively to the mask region, depositing a third insulation layer over the first surface, and etching the third insulation layer so that a semiconductor mesa of the semiconductor body arranged next to the at least one trench is exposed at the first surface.

20 Claims, 15 Drawing Sheets

(51) Int. Cl.
*H01L 29/78* (2006.01)
*H01L 21/033* (2006.01)
*H01L 21/311* (2006.01)
*H01L 21/768* (2006.01)
*H01L 21/308* (2006.01)
*H01L 29/06* (2006.01)
*H01L 29/10* (2006.01)
H01L 29/417 (2006.01)

(56) References Cited

U.S. PATENT DOCUMENTS

| | | |
|---|---|---|
| 9,082,746 B2* | 7/2015 | Poelzl |
| 2002/0008284 A1 | 1/2002 | Zeng |
| 2003/0038886 A1 | 2/2003 | Fujii et al. |
| 2004/0089910 A1 | 5/2004 | Hirler et al. |
| 2004/0173844 A1 | 9/2004 | Williams et al. |
| 2006/0141739 A1 | 6/2006 | Poelzl |
| 2006/0273386 A1 | 12/2006 | Yilmaz et al. |
| 2007/0063269 A1 | 3/2007 | Ng et al. |
| 2010/0055892 A1* | 3/2010 | Poelzl ............... H01L 29/66666 438/595 |
| 2011/0095360 A1 | 4/2011 | Krumrey et al. |
| 2012/0068260 A1 | 3/2012 | Poelzl |
| 2012/0184095 A1* | 7/2012 | Poelzl ................ H01L 29/7813 438/589 |

* cited by examiner

METHOD FOR FORMING SEMICONDUCTOR COMPONENTS HAVING SELF-ALIGNED TRENCH CONTACTS

TECHNICAL FIELD

Embodiments of the present invention relate methods for producing semiconductor components having trench contacts which are self-aligned to trench gate electrodes, in particular to semiconductor transistors with a field electrode arranged below the gate electrode, and to related semiconductor components.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low switching losses are often desired. In order to reduce switching losses, there are ongoing developments to reduce distances between neighboring unit cells of power devices. For example, the lateral distance between a trench gate electrode and the contact to source region and body region of the transistor may be reduced using self-aligned techniques. However, this typically requires that the oxide isolation to the source metallization has to be arranged in the trench resulting in a higher process variation. To compensate these variations the vertical depth of the trench may be increased. This results however in higher capacitances. Accordingly, switching losses may be increased.

Accordingly, there is a need to provide improved methods for forming self-aligned contacts of semiconductor components.

SUMMARY

According to an embodiment of a method for producing a semiconductor component, the method includes: providing a semiconductor arrangement having a semiconductor body with a first surface and being comprised of a first semiconductor material extending to the first surface. At least one trench extends from the first surface into the semiconductor body and includes a conductive region insulated from the semiconductor body and arranged below the first surface. The method further includes: forming a second insulation layer on the first surface with a recess that overlaps in projection onto the first surface with the conductive region, forming a mask region in the recess, and etching the second insulation layer selectively to the mask region and the semiconductor body to expose the semiconductor body at the first surface, depositing a third insulation layer on the first surface, and etching the third insulation layer so that a semiconductor mesa of the semiconductor body arranged next to the at least one trench is exposed at the first surface.

According to an embodiment of a method for producing a semiconductor component, the method includes: providing a semiconductor arrangement having a semiconductor body with a first surface and being comprised of a first semiconductor material extending to the first surface. At least one trench extends from the first surface into the semiconductor body and includes a gate electrode insulated from the semiconductor body and arranged below the first surface. The method further includes: depositing an insulation layer on the first surface and on the gate electrode so that that the insulation layer has a recess that is, in a projection onto the first surface, completely arranged within the at least one trench. The recess is filled with a non-crystalline form of the first semiconductor material to form a mask region.

According to an embodiment of a method for producing a semiconductor component, the method includes: providing a semiconductor arrangement having a semiconductor body with a first surface and being comprised of a first semiconductor material extending to the first surface. At least one trench extends from the first surface into the semiconductor body and includes a gate electrode insulated from the semiconductor body and arranged below the first surface. The method further includes: depositing an insulation layer on the first surface and on the gate electrode so that that the insulation layer has a recess that is, in a projection onto the first surface, completely arranged within the at least one trench. A dielectric material is deposited on the insulation layer and plasma etched using the insulation layer as an etch-stop.

According to an embodiment of a field effect semiconductor component, the field effect semiconductor component includes a semiconductor body having a first surface defining a vertical direction and at least one trench extending from the first surface in the semiconductor body. The at least one trench includes a gate electrode below the first surface and being insulated from the semiconductor body. A first metallization is arranged on the first surface and in electric contact with the semiconductor body. An insulation structure is arranged between the gate electrode and the first metallization. The insulation structure includes a silicon oxide layer adjoining an upper surface of the gate electrode, extending above the first surface and comprising a recess completely arranged within the gate electrode when seen from above. The insulation structure further includes a silicon nitride region arranged in the recess and between the silicon oxide layer and the first metallization.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
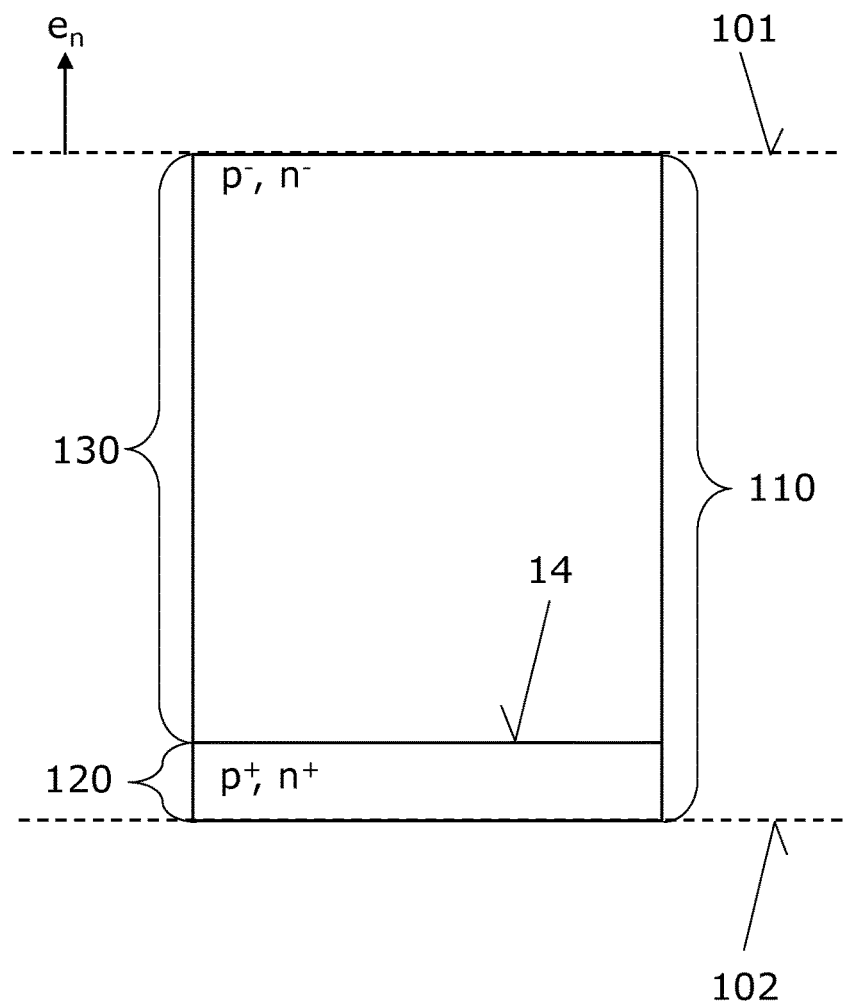
FIGS. 1 to 8 illustrate vertical cross-sections through a semiconductor device during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, methods for forming semiconductor transistor devices or components, in particular to methods for forming field effect transistor devices. Within this specification the terms "semiconductor device" and "semiconductor component" are used synonymously. The formed semiconductor device is typically a vertical semiconductor device such as a vertical IGBT or a vertical MOSFET with an insulated field electrode arranged in a vertical trench and an insulated gate electrode arranged in the vertical trench and above the insulated field electrode. Typically, the formed semiconductor device is a power semiconductor device having an active area for carrying and/or controlling a load current and a peripheral area.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistivity contact with a drain or collector electrode. The source region or emitter region is in ohmic contact with a source or emitter electrode.

In the context of the present specification, the term "gate electrode" intends to describe an electrode which is situated next to, and insulated from the body region and configured to form and/or control a channel region.

In the context of the present specification, the terms "field electrode" and "field electrode" intend to describe an electrode which is arranged next to a semiconductor region, typically the drift region, insulated from the semiconductor region, and configured to expand a depleted portion in the semiconductor region by applying an appropriate voltage, typically a negative voltage for an n-type drift region.

In the context of the present specification, the term "mesa" or "mesa region" intends to describe a semiconductor region between two adjacent trenches extending into the semiconductor substrate or body in a vertical cross-section.

FIGS. 1 to 8 illustrate a method for forming a semiconductor device 100 according to several embodiments in vertical cross-sections. These figures show vertical cross-sections through a semiconductor body during or after particular method steps. The illustrated cross-sections typically correspond to only a section through an active area of the semiconductor device, for example to a section through a unit cell of the semiconductor device. The semiconductor device may include a plurality of unit cells in the active area. Furthermore, the semiconductor device may include contact areas for contacting the electrodes of the active area and/or a peripheral area for forming additional edge termination structures such as field electrodes, guard rings and the like.

In a first process, a semiconductor body 110, for example a wafer or substrate 110, having a first surface 101 and a second surface 102 opposite the first surface 101 is provided. The normal direction $e_n$ of the first surface 101 is substantially parallel to the vertical direction.

The semiconductor body 110 can be a single bulk mono-crystalline material. It is also possible that the semiconductor body 110 includes a bulk mono-crystalline material 120 and at least one epitaxial layer 130 formed thereon. Using the epitaxial layer(s) 130 provides more freedom in tailoring the background doping of the material since the doping concentration can be adjusted during deposition of the epitaxial layer or layers.

In the exemplary embodiment illustrated in FIG. 1, the semiconductor body 110 includes a $p^+$-type or an $n^+$-type semiconductor layer 120 extending to the second surface 102 and a $p^-$-type or $n^-$-type semiconductor layer 130 arranged on semiconductor layer 120 extending to the first surface 101. The doping relations may also be reversed.

Depending on the semiconductor device to be manufactured a pn-junction 14 may be formed between semiconductor layer 130 and semiconductor layer 120.

In the following, embodiments pertaining to manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

Figure 2:
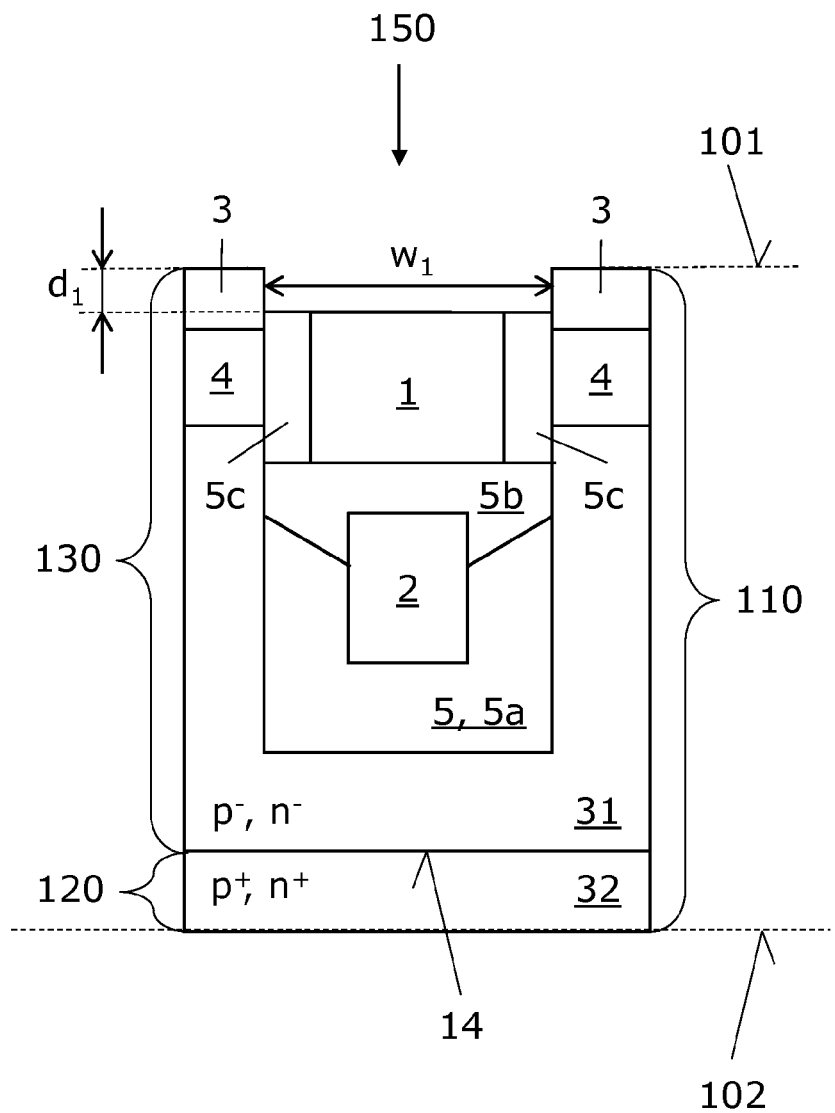

Referring to FIG. 2, further processes are explained. A trench 150 is formed, typically etched, from the first surface 101 into the semiconductor body 110. At least a conductive region 1 is formed in the trench 150 so that the conductive region 1 is insulated from the semiconductor body 110 by an insulation layer 5c and arranged below the first surface 101. In the semiconductor component to be produced, the conductive region 1 and the insulation layer 5c typically form a gate electrode and a gate dielectric, respectively. Forming the conductive region 1 typically includes depositing a conductive material such as doped poly-silicon and recessing an uppermost portion of the trench 150 arranged next to the first surface 101.

In the exemplary embodiment, the conductive region 1 is formed above a field electrode 2 formed in a lower portion of trench 150. The field electrode 2 is insulated from the semiconductor body 100 by a first insulation layer 5a typically forming a field dielectric 5a in the lower trench portion. For this purpose the field dielectric 5a is arranged between the field electrode 2 and the bottom and the sidewalls of the trench 150 in the lower trench portion. In other embodiments, the trench 150 only includes the insulation layer 5c and the conductive region 1.

The field electrode 2 is, for example, made of a metal or a doped polycrystalline semiconductor material, such as polysilicon. The field electrode dielectric 5a is, for example, made of an oxide, such as silicon oxide.

Thereafter, an insulating layer 5b is typically formed on the field electrode 2 in the trench 150. In the component to be produced insulating layer 5b will be arranged between the field electrode 2 and a gate electrode formed by conductive region 1 and will, therefore, be referred to as inter-electrode dielectric in the following. Forming the inter-electrode dielectric 5b may involve a deposition process that deposits a dielectric material on the field electrode 2. The deposition process may have a higher deposition rate on horizontal surfaces than on vertical ones such as the sidewalls of the upper trench portion. Forming the inter-electrode dielectric 5b may further involve at least partly removing the deposited dielectric material from the first surface 101 and the sidewalls of the upper trench portion. For example, the dielectric material may completely be removed from the first surface 101 and the sidewalls of the upper trench portion, while remaining on or above the field electrode 2. The dielectric material remaining on the field electrode 2 forms the inter-electrode dielectric 5b.

Thereafter, a gate dielectric 5c is typically formed on sidewalls of the upper trench portion that remains after forming the inter-electrode dielectric 5b. The gate dielectric 5c is, for example, formed by a thermal oxidation process.

Thereafter, the upper portion of the trench 150 that remains after forming the inter-electrode dielectric 5b and the gate dielectric 5c is filled with an electrode material, thereby forming a conductive region 1 and gate electrode 1, respectively. The electrode material is, for example, a metal or a doped polycrystalline semiconductor material, such as polysilicon.

Insulation layers 5a, 5b, 5c are typically comprised of silicon oxide and may in this embodiment considered as a common first insulation layer or region 5 insulating the gate electrode 1 and the field electrode 2 from each other and the semiconductor body 110.

Further, a body region 4 is formed in the semiconductor body 110 adjacent the gate dielectric 5c, a source region 3 or an emitter region 3 is formed in the body region 4 and adjacent the gate dielectric 5c for example, by implanting dopants via the first surface 101 into the semiconductor body 110. The semiconductor device to be produced may be operated as a MOSFET or an IGBT. In embodiments related to forming a MOSFET 100, semiconductor regions 3, 32 form a source region 3 and a drain region 32, respectively. In embodiments related to forming an IGBT 100, semiconductor regions 3, 32 form an emitter region 3 and a collector region 32, respectively. For sake of clarity, semiconductor regions are in the following mainly termed as used for MOSFETs. This is however not to be understood as limiting to MOSFETs. For example, a semiconductor region termed as source region may also represent an emitter region in a similar IGBT-structure.

The depth of the trench 150 may be between about 0.75 µm and about 7.5 µm from the first surface 101 to its bottom depending on the breakdown voltage class, i.e. the desired voltage blocking capability, of the MOSFET.

In one embodiment, width $w_1$ of the trench 150, i.e. a horizontal extension between adjoining mesas, is between about 0.25 µm and about 2.5 µm. A thickness of the field electrode dielectric 5a is, for example, between about 75 nm and about 750 nm. The field electrode 2 has typically a vertical extension between about 25% up to almost 100% of the depth of the trench 150. In a transistor component having a voltage blocking capability of, for example, 150 V the trench 150 has a depth of between 6 µm and 7 µm, and the body region 4 has a vertical dimension of between about 0.5 µm and 1 µm. The distance between two neighbouring trenches 150 in a horizontal direction may be between about 0.3 µm and 3 µm, this distance corresponding to a dimension of the semiconductor body 110 mesa region between the two trenches 150.

The width $w_1$ of at least the uppermost portion of the trench 150 in the vertical cross-section is typically in a range from about 100 nm to about 1 µm, more typical between about 200 nm and 500 nm, for example about 250 nm.

FIG. 2 illustrates the semiconductor structure after recessing the trench 150 at the first surface 101, for example by masked etching. In doing so, an uppermost portion of the trench 150 is typically exposed. The uppermost portion may extend a few nm from the first surface 101 into the trench 150. Typically, the depth $d_1$ of the exposed uppermost trench portion is in a range from about 20 nm to about 200 nm.

Figure 3:
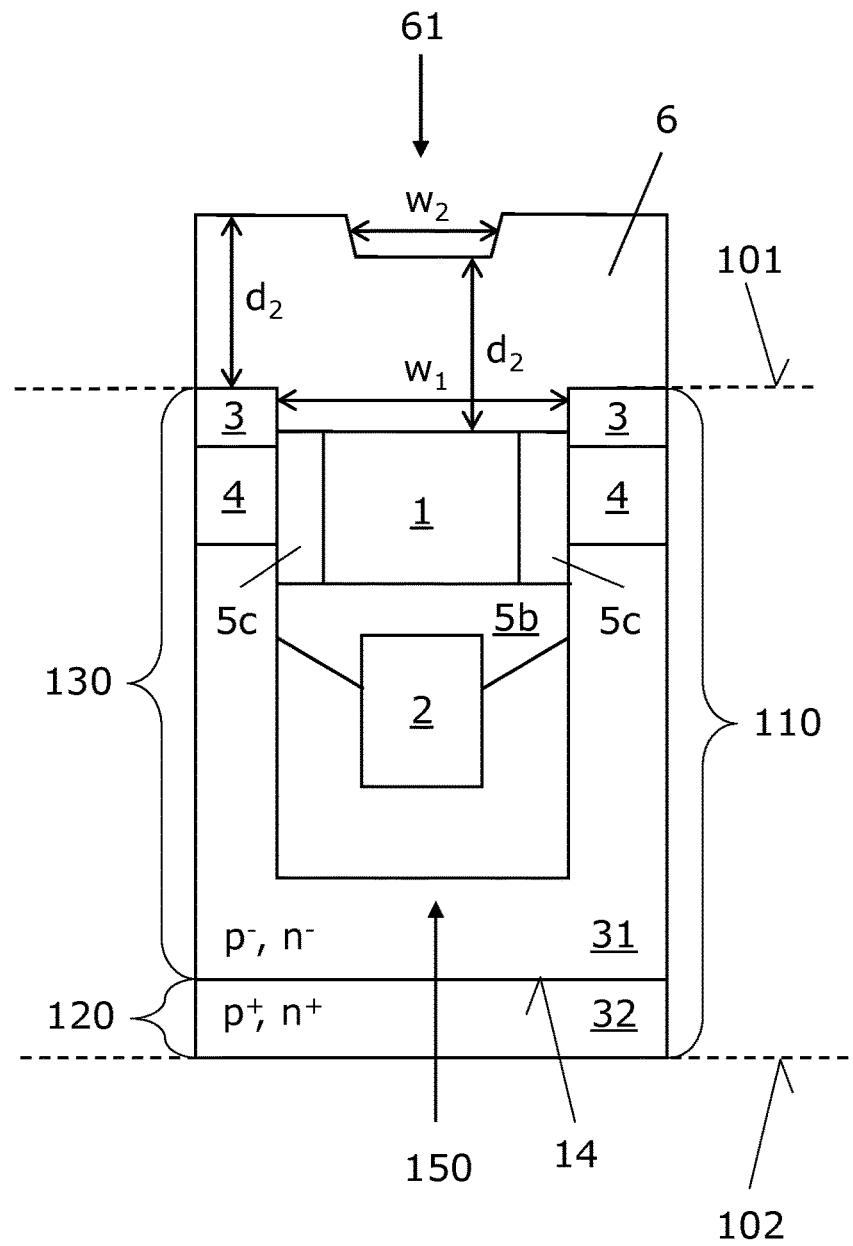

Referring to FIG. 3, a second insulation layer 6 is formed on the first surface 101 such that the second insulation layer 6 has a recess 61 that overlaps in projection onto the first surface 101 with the gate electrode 1. Typically, the recess 61 is in projection on the first surface 101 completely arranged within the two side walls of the trench 150. Accordingly, the width $w_2$ of the recess 61 is typically smaller than the width $w_1$, and may only be 10 nm or even less.

The second insulation layer 6 is typically formed by mask-less deposition on the first surface 101. A deposition process used for forming the second insulation layer 6 may be a selective deposition process having a deposition rate that is dependent on an orientation of surfaces on which the second insulation layer 6 is to be deposited. The deposition process may have a higher deposition rate on horizontal surfaces than on vertical surfaces. In one embodiment, the deposition process is a high density plasma (HDP) process to form insulation layer 6 as a HDP-oxide-layer (High Density Plasma-oxide layer). HDP processes are plasma supported deposition/sputter processes that are commonly known, so that no further explanations were required. Typically, the deposition rate on horizontal surfaces is at least 5 times higher than the deposition rate on vertical surfaces, i.e. on the exposed side wall of the vertical trench 150. The deposition rate on horizontal surfaces may for example be about 10 times higher than the deposition rate on vertical surface. Accordingly, a comparatively thick insulation layer 6 with a recess may be formed. The vertical thickness $d_2$ of the insulation layer 6 on horizontal surfaces and the mesa, respectively, may be up to but less than about 2.5 times of the width $w_1$ of vertical trench 150 or even up to but less than about 5 times of the width $w_1$ of vertical trench 150.

The second insulation layer 6 may however also be formed by conformal deposition. According to an embodiment, the second insulation layer 6 is formed as a TEOS-layer (TetraEthylOrthoSilicate-layer), for example as a thermal TEOS or plasma enhanced TEOS (PETEOS). In this embodiment, the thickness $d_2$ of the insulation layer 6 on horizontal surfaces is typically chosen such that $2*d_2$ is smaller than the width $w_1$ of the vertical trench 150 to ensure forming the recess 61. Accordingly, the vertical thickness $d_2$ of the insulation layer 6 on horizontal surfaces and the mesa, respectively, may be up to but less than about half the width $w_1$ of vertical trench 150.

Figure 4:
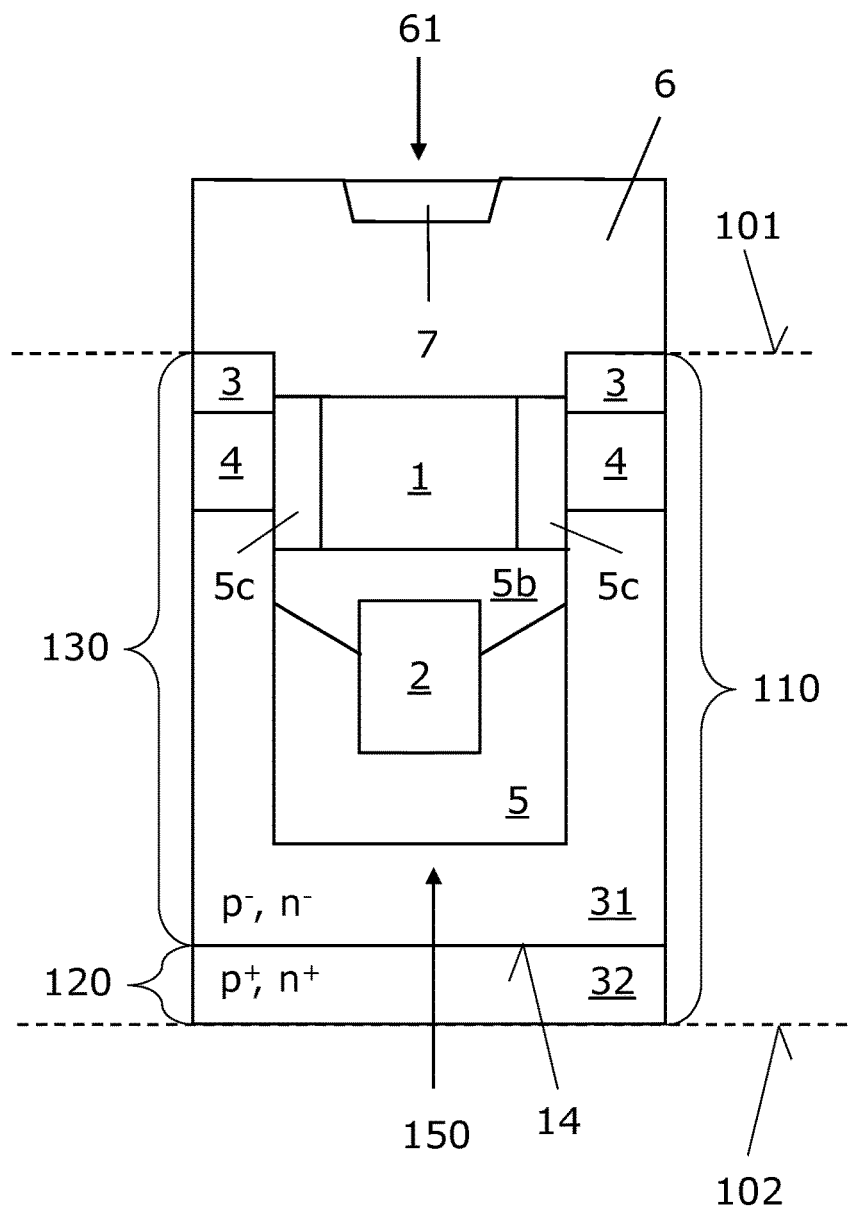

Referring to FIG. 4, a polycrystalline semiconductor material, typically a poly-silicon layer is deposited on the second insulation layer 6 and planarized using, for example, a chemical-mechanical polishing (CMP) process to form a mask region 7 in the recess 61. The insulation layer 6 is typically used as a CMP-stop. The mask region 7 is formed self-aligned to the trench 150.

Figure 5:
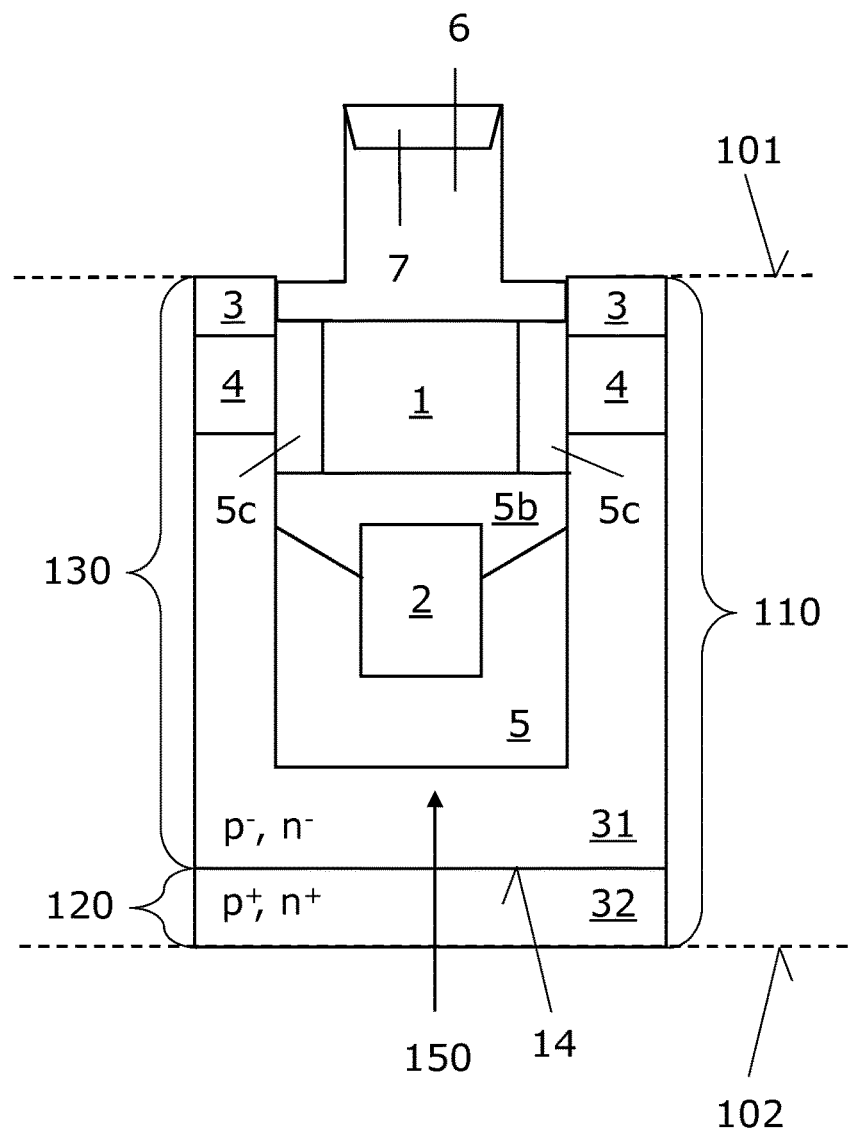

Referring to FIG. 5, the second insulation layer 6 is etched selectively to the mask region 7 and the semiconductor body 110 to expose the semiconductor body 110 at the first surface 101, i.e. the mesas adjoining the side walls of the trench 150. The second insulation layer 6 is typically formed as a silicon oxide. Thus an anisotropic oxide etching is typically used to expose the mesas. In this process, the mask region 7 is used as a mask and etch-stop, respectively.

Figure 6:
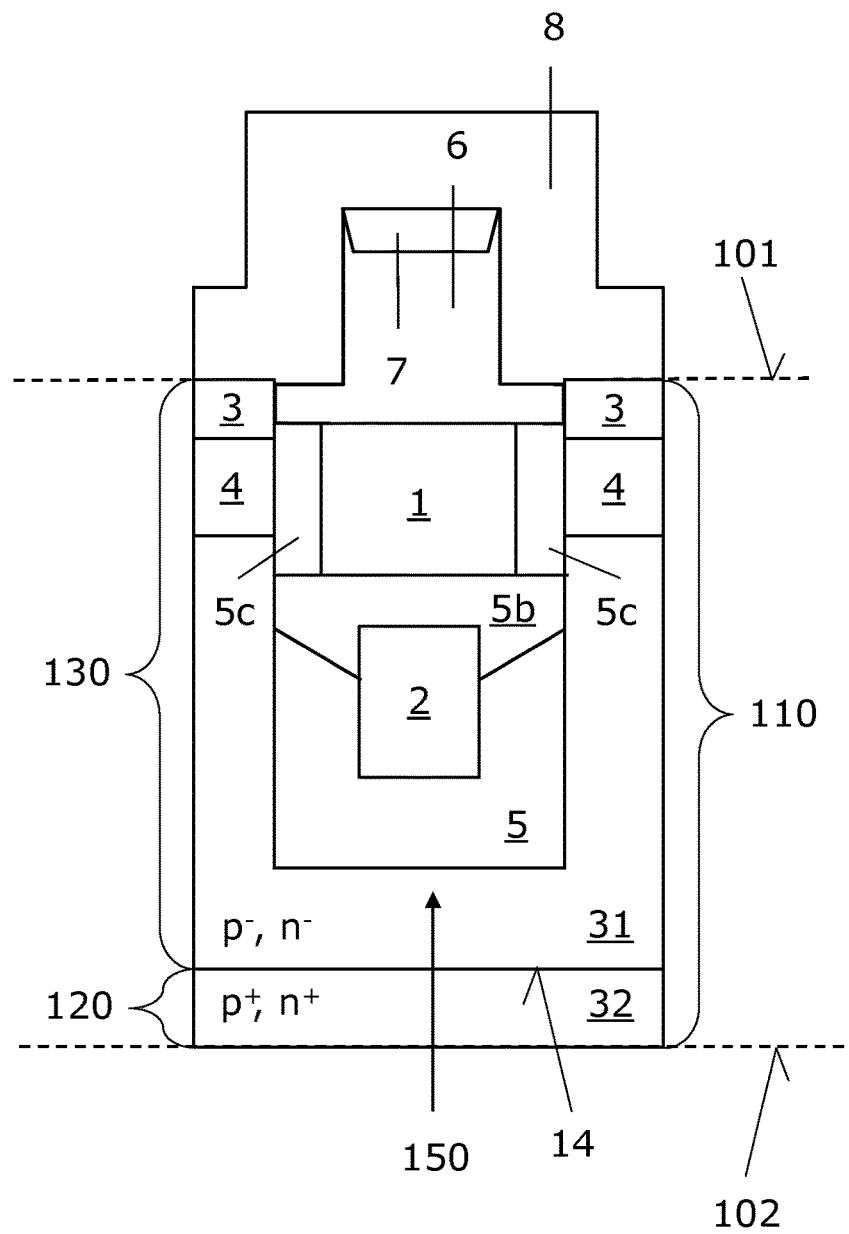

Referring to FIG. 6, a third insulation layer 8 is deposited on the first surface 101, for example by conformal deposition. Typically, the third insulation layer 8 is also formed by mask-less deposition. The third insulation layer 8 may be formed as a TEOS-layer, an USG-layer (Undoped Silicate Glass-layer), or a doped oxide layer, for example a PSG-layer (PhosphoSilicate Glass), a BPSG-layer (BoroPhosphoSilicate Glass) or a BSG-layer (BoroSilicate Glass). The thickness of the third insulation layer 8 mainly determines the width of the spacer in the semiconductor device 100 to be produced.

In the following, the second insulation layer 6 and the third insulation layer 8 are also referred to as insulation layer 6 and further insulation layer 8, respectively.

Figure 7:
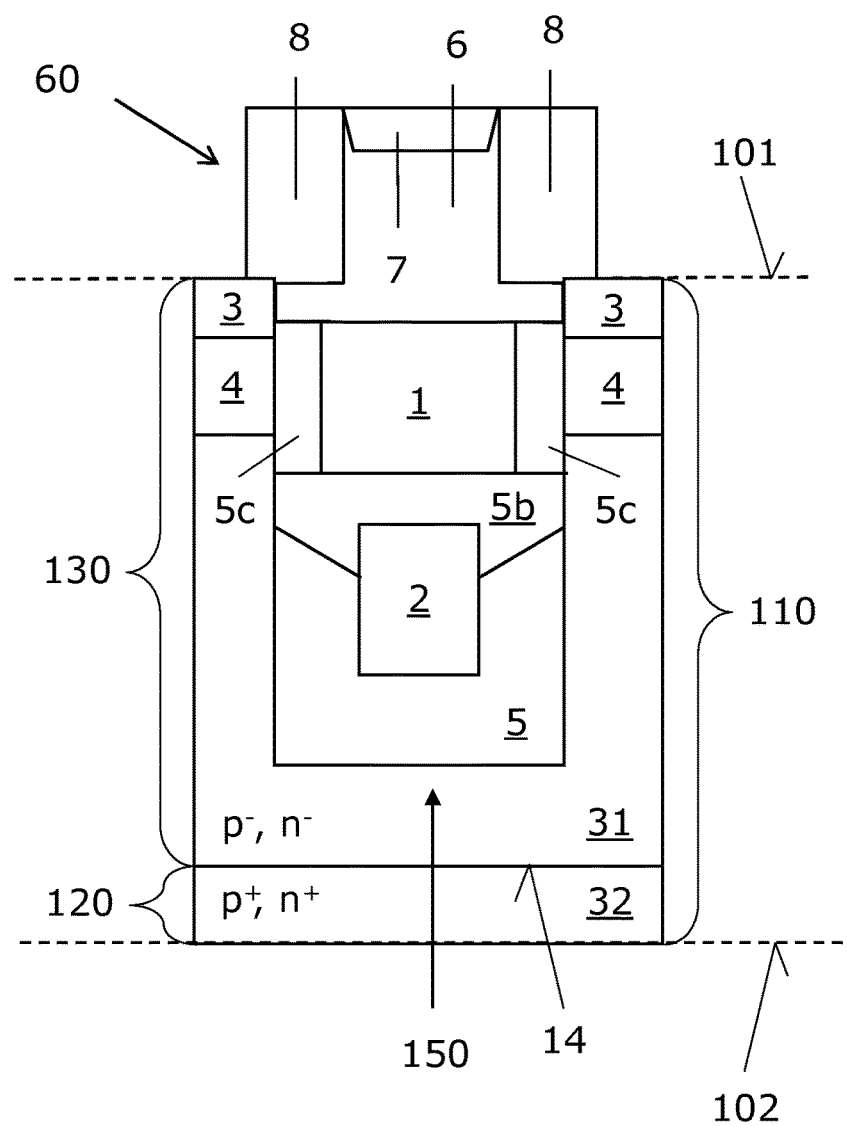

Referring to FIG. 7, the third insulation layer 8 is etched so that the semiconductor mesas adjacent the trench 150 are exposed at the first surface 101. This is typically achieved by anisotropic etching, more typically by anisotropic oxide etching. Accordingly, an insulating structure 60 comprising remaining portions of the second insulation layer 6 and the third insulation layer 8 is formed in a self-aligned manner with respect to the trench 150. In the semiconductor device 100 to be produced, the insulating structure 60 forms an insulation between a source or emitter metallization and the gate electrode 1. The insulating structure 60 is typically about 50 nm to about 100 nm wider than the width $w_1$ of the uppermost portion of the trench 150 formed between the gate electrode 1 and the first surface 101. For example, for a trench width $w_1$ of about 250 nm, the width of the insulating structure 60 in the vertical cross-section may be in a range from about 350 nm to about 450 nm. Since the insulating structure 60 covers at most a tiny area of the adjoining mesa region, self-aligned contacts to the mesas may be formed with small area requirement. This is explained in the following.

The insulating structure 60 may be used as etching mask to form shallow contact trenches 160 next to the trench 150 in a self-aligned manner. In this process, the mask region 7 is typically also removed. Thereafter, highly doped body contact regions 41 may be formed, for example by depositing of doped poly-silicon region 10a and out-diffusion of dopants.

Figure 8:
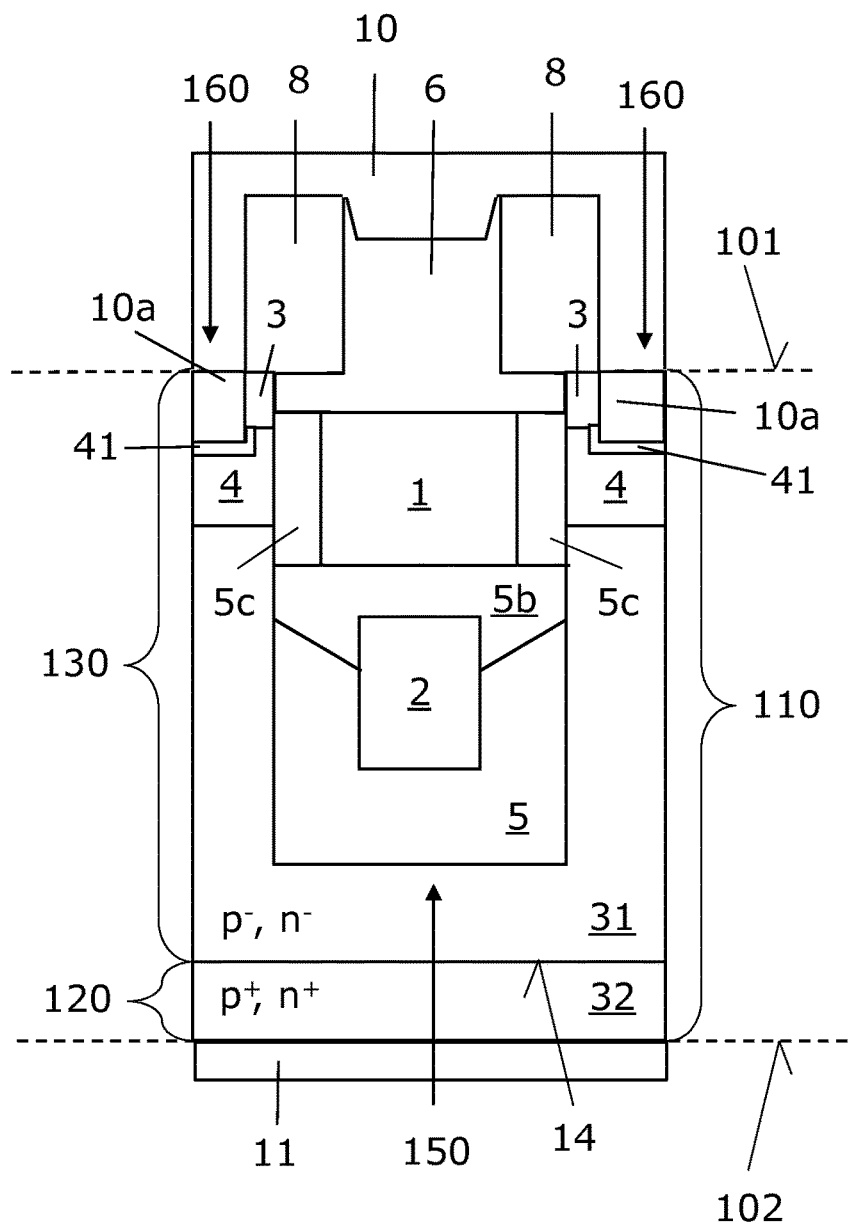

Thereafter, a first metallization 10 forming a source metallization or an emitter metallization may be deposited on the first surface 101 for electric contacting the semiconductor regions 3, 4 and 41, respectively. Further, a second metallization 11 forming a drain metallization or a collector metallization is typically formed on the second surface 102. The resulting semiconductor device 100 is illustrated in FIG. 8. Depending on doping types of the semiconductor regions 31, 32, the semiconductor device 100 may be operated as a MOSFET or an IGBT.

Alternatively, the contact between the first metallization 10 and the mesas next to the trench 150 may be formed substantially on or at the first surface 101.

The contacts between the mesas and the first electrode 10 are formed in a self-aligned manner using standard processes that take advantage of the different topology of the trench 150 with the insulating structure 60 protruding out of the first surface 101 and the adjoining mesas extending to the first surface 101 as illustrated in FIG. 6. The processes are carried out such that structures already formed in the trench 150 are at least in lower portions not affected. Accordingly, these structures may be optimized substantially independent to the mesa contacts, for example with regard to capacitances. Accordingly, switching losses of the semiconductor device may be reduced.

The method for forming semiconductor device 100 may also be described as providing a semiconductor arrangement with a semiconductor body 110 of a first semiconductor material extending to a first surface 101 and at least one trench 150 extending from the first surface 101 into the semiconductor body 110. The at least one trench 150 includes a gate electrode 1 which is insulated from the semiconductor body 110 and arranged next to the first surface 101. An uppermost portion of the at least one trench 150 is recessed from the first side surface 101 by etching. Accordingly, a semiconductor arrangement is provided which includes a semiconductor body 110 having a first semiconductor material extending to a first surface 101 and at least one trench 150 extending from the first surface 101 into the semiconductor body 110. The at least one trench 150 includes a gate electrode 1 which is insulated from the semiconductor body 110 and arranged below the first surface 101. Typically, an insulated field electrode 2 is formed below gate electrode 1.

An insulation layer 6 is deposited on the first surface 102 and on the gate electrode 1 so that the insulation layer 6 has a recess 61 that is, in a projection onto the first surface 101, completely arranged within the trench 150. Typically, the insulation layer 6 is deposited such that the at least one trench 150 is at least completely filled.

Thereafter, the recess 61 is filled with a non-crystalline form of the first semiconductor material to form a mask region 7.

Typically, the provided semiconductor arrangement includes an insulated field electrode 2 in a lower portion of the at least one trench 150. A gate dielectric region 5c is formed such that the gate dielectric region 5c at least lines side walls of the at least one trench 150 in an upper portion. The gate electrode 1 is typically formed by depositing a conductive material such as doped poly-silicon on the insulated field electrode 2 in the at least one trench 150 and back etching.

According to an embodiment, an insulation structure 60 arranged on the gate electrode 1 and extending above the first surface 101 is formed by anisotropic etching the insulation layer 6 using the mask region 7 as a mask.

Furthermore, a self-aligned contact to at least one of a source region 3, an emitter region 2 and a body region 4 arranged in a semiconductor mesa next to the at least one trench 150 is formed. Forming the self-aligned contact typically includes depositing a third insulation layer 8 on the first surface 101 and anisotropic etching of the third insulation layer 8 to expose the semiconductor mesa.

FIGS. 9 to 15 illustrate a method for forming a semiconductor device 200 according to several embodiments in vertical cross-sections. These figures also show vertical cross-sections through a semiconductor body during or after particular method steps.

The first method steps for forming semiconductor device 200 are similar as explained above with regard to FIGS. 1 and 2 for the semiconductor device 100. After forming a semiconductor structure 200 as illustrated in FIG. 2, a second insulation layer 6 is formed on the first surface 101, typically as a TEOS-layer having a recess 61 that overlaps in projection onto the first surface 101 with the gate electrode 1. The thickness $d_2$ of the TEOS insulation layer 6 on horizontal surfaces is typically chosen such that $2*d_2$ is smaller or substantially equal to the width $w_1$ of the vertical trench 150 of, for example 250 nm, to ensure forming the recess 61. Alternatively, the second insulation layer 6 may be formed as a HDP-layer.

Typically, the recess 61 is in projection on the first surface 101 completely arranged within the two side walls of the trench 150 and/or the gate electrode 1.

Figure 9:
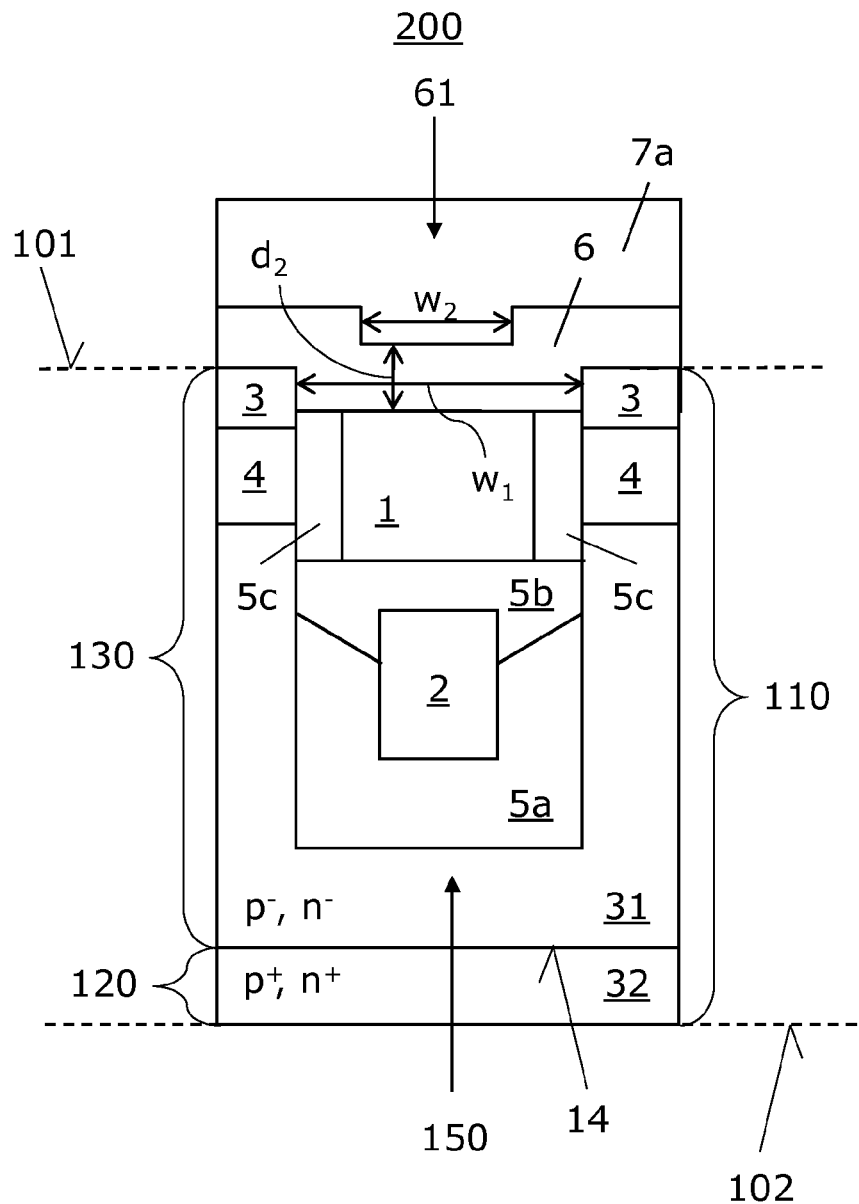
FIGS. 9 to 15 illustrate vertical cross-sections through a semiconductor device during method steps of a method according to further embodiments.

Thereafter, a dielectric layer 7a, typically a silicon nitride layer, is formed by deposition on the second insulation layer 6. The resulting semiconductor structure 200 is illustrated in FIG. 9.

The materials of dielectric layer 7a and the second insulation layer 6 are chosen such that dielectric layer 7a and the second insulation layer 6 are selectively etchable with respect to each other. Typically, a mask is used for depositing the dielectric layer 7a. Accordingly, forming of gate contacts in a not illustrated contact area of the semiconductor device 200 is facilitated.

Figure 10:
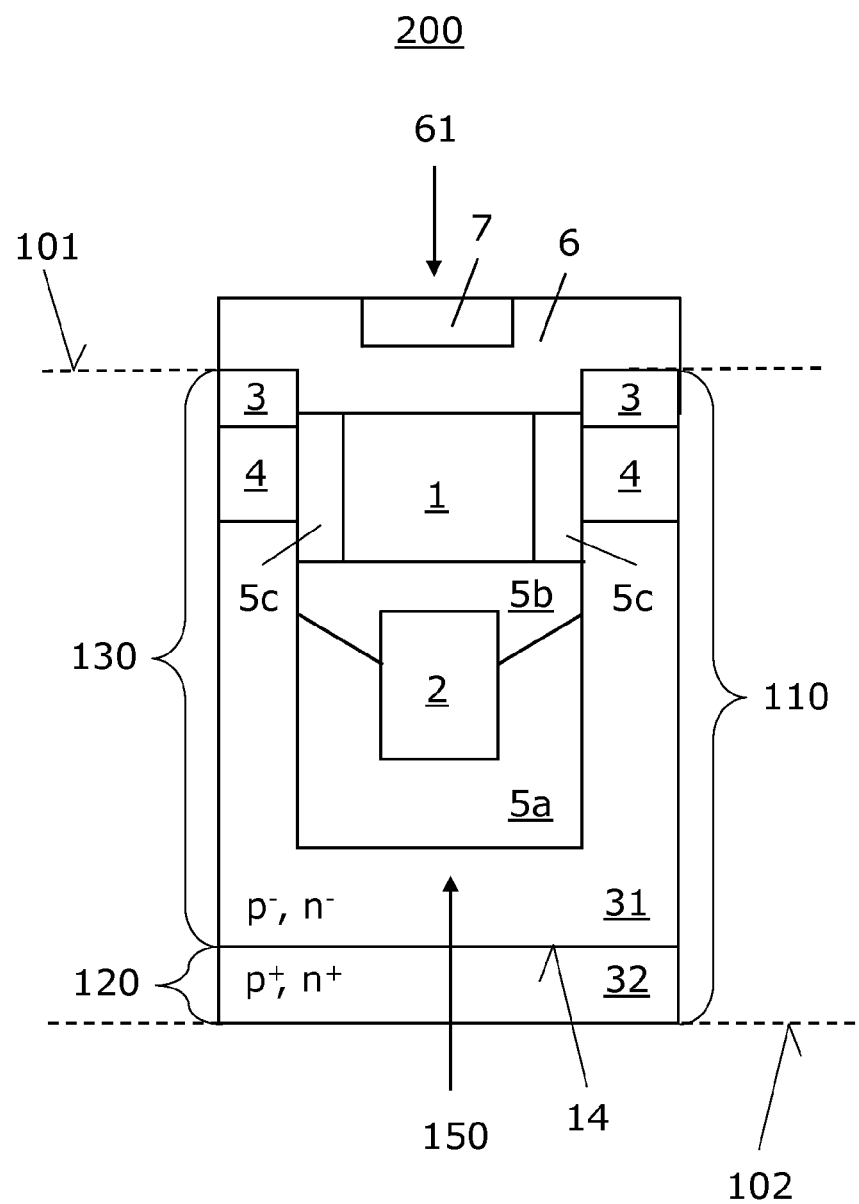

Referring to FIG. 10, dielectric layer 7a is etched selective to the second insulation layer 6 to form a dielectric mask region 7 in the recess 61. This is typically done by plasma etching. The mask region 7 is typically formed such that, in a cross-section substantially orthogonal to the first surface 101, a ratio between of a width $w_2$ of the mask region 7 and a width $w_1$ of the trench 150 is smaller or equal than about 1:3.

Figure 11:
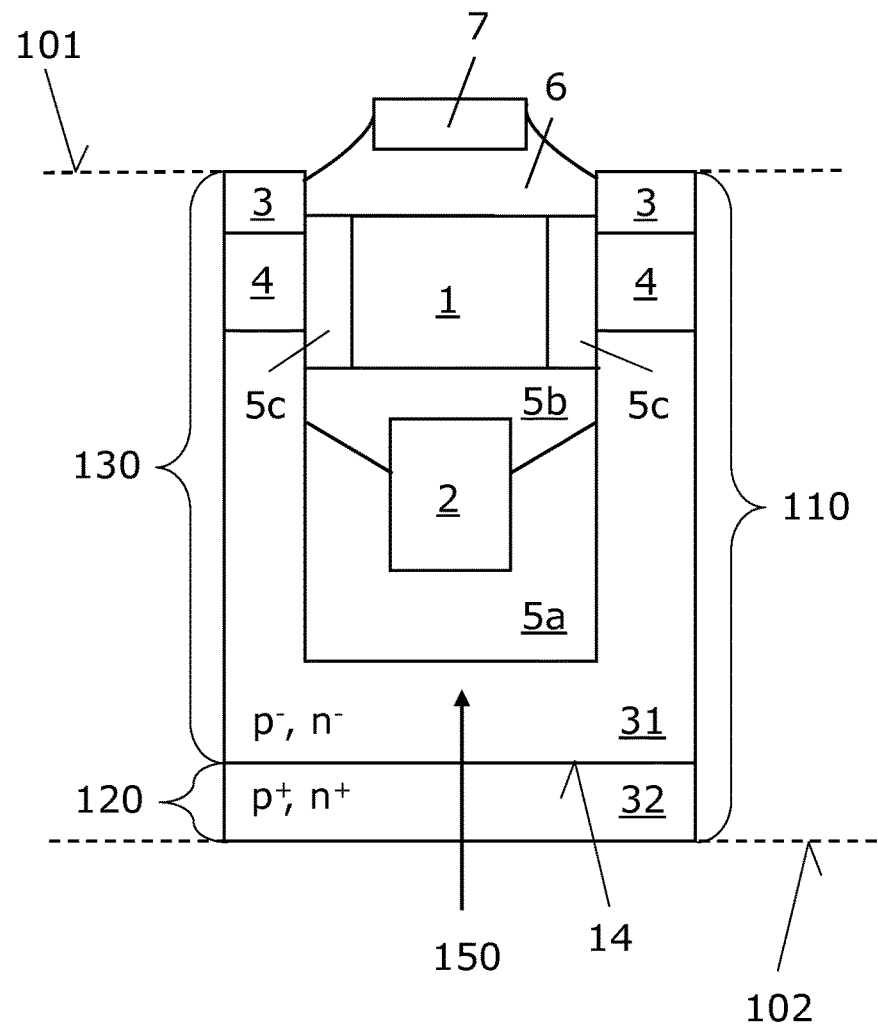

Referring to FIG. 11, the second insulation layer 6 is etched selective to the dielectric mask region 7. Typically, a process having an etching rate of the second insulation layer 6 that is at least 10 times higher, for example up to 20 times higher, than an etching rate of the mask region 7. For example, plasma etching such as a CHF3 plasma etching may be used to etch silicon oxide of the second insulation layer 6 highly selective to a silicon nitride mask region 7.

Figure 12:
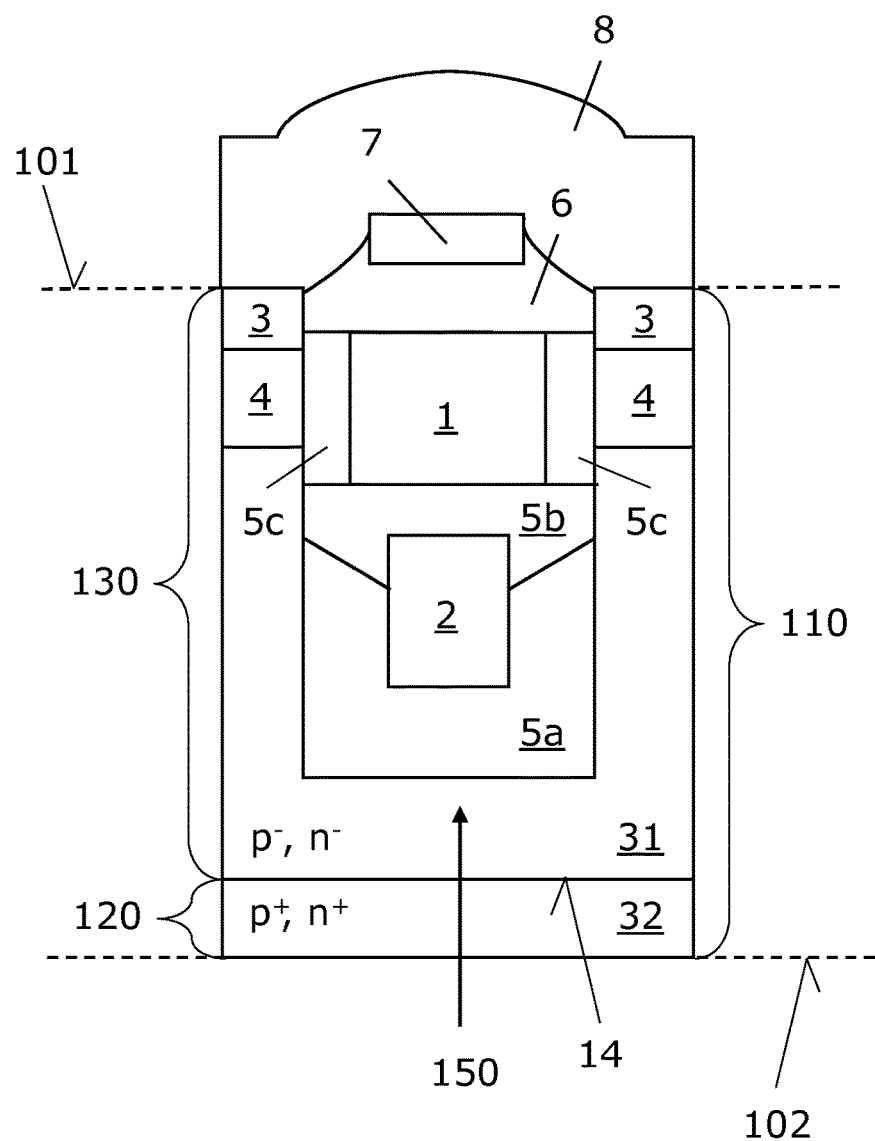

Referring to FIG. 12, a third insulation layer 8 is deposited on the first surface 101, for example by conformal deposition. Typically, the third insulation layer 8 is also formed by mask-less deposition. The third insulation layer 8 may be formed as a TEOS-layer, an USG-layer, or a doped oxide layer, for example a PSG-layer, a BPSG-layer or a BSG-layer. The thickness of the third insulation layer 8 mainly determines the width of the spacer in the semiconductor device 200 to be produced.

Figure 13:
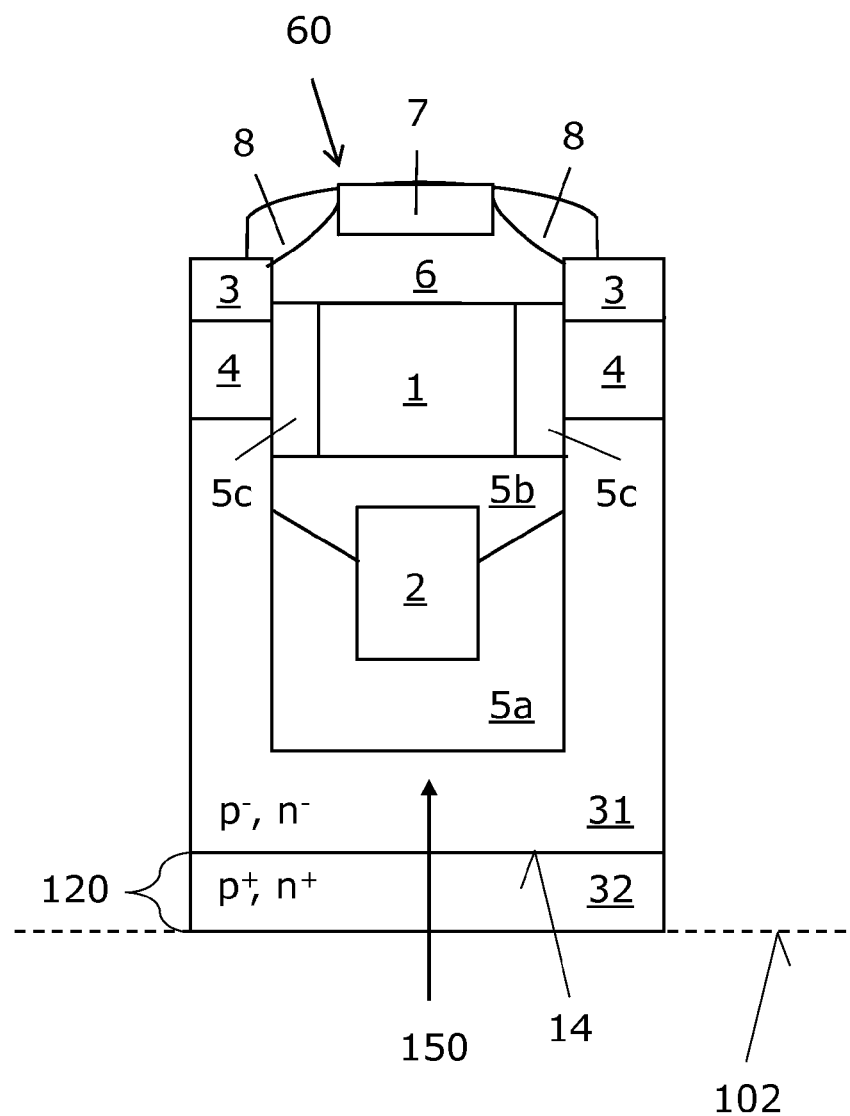

Referring to FIG. 13, the third insulation layer 8 is etched so that the semiconductor mesas adjacent the trench 150 are exposed at the first surface 101. This is typically achieved by anisotropic etching, more typically by anisotropic oxide etching. Accordingly, an insulating structure 60 comprising remaining portions of the mask region 7, the second insulation layer 6 and the third insulation layer 8 is formed in a self-aligned manner with respect to the trench 150. In the semiconductor device 200 to be produced, the insulating structure 60 forms an insulation between a source or emitter metallization and the gate electrode 1.

Figure 14:
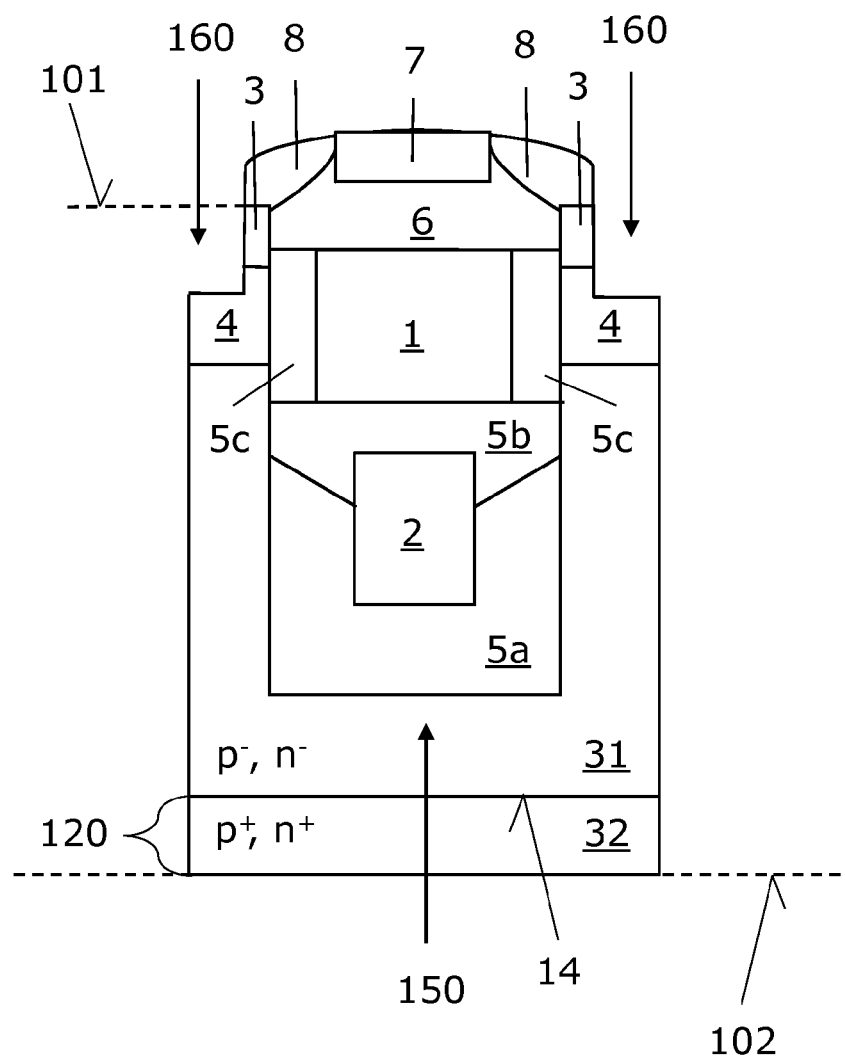

Referring to FIG. 14, the insulating structure 60 is used as etching mask to form shallow contact trenches 160 next to the trench 150 in a self-aligned manner using for example a wet or dry silicon etching process.

Figure 15:
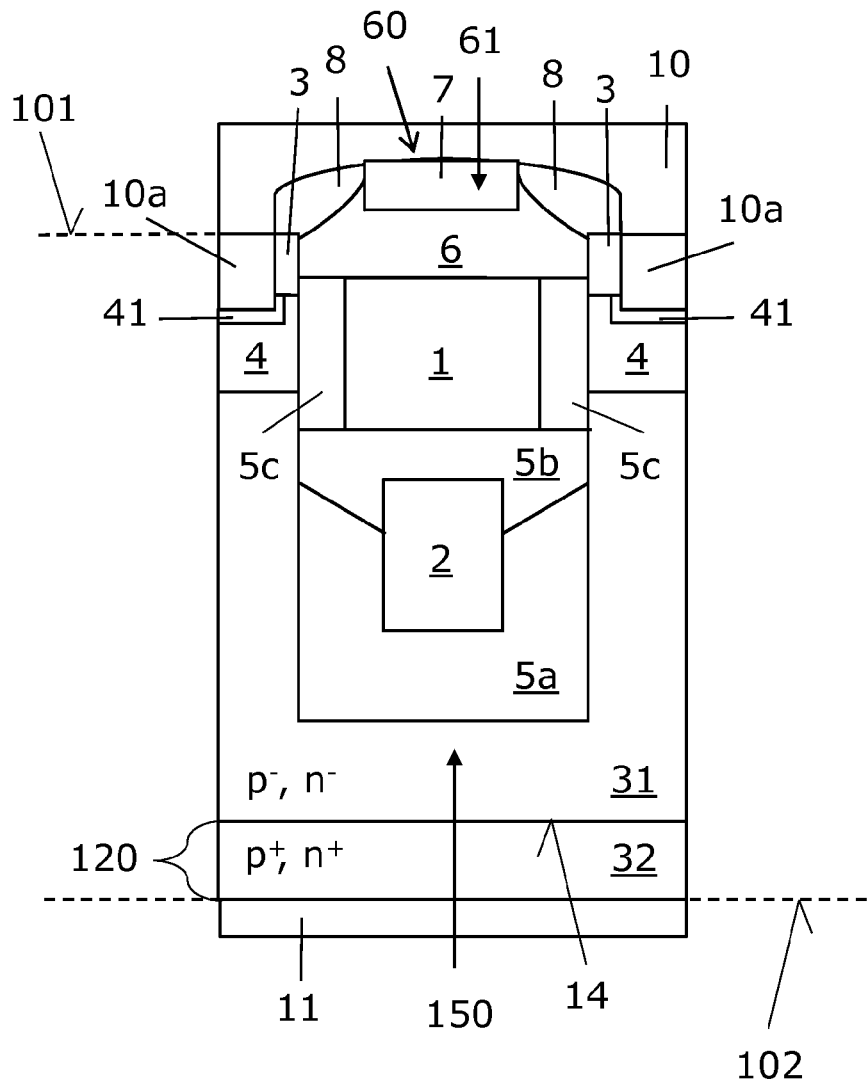

Thereafter, highly doped body contact regions 41 may be formed, for example by depositing of doped poly-silicon region 10a and out-diffusion of dopants. A first metallization 10 and a second metallization 11 may be deposited on the first surface 101 and second surface 102, respectively, similar as explained above with regard to FIG. 8. In doing so, contact to a source region 3, an emitter region 3 and/or body region 4 arranged in the semiconductor mesa next to the trench 150 is formed in a self-aligned manner with respect to the vertical trench 150. The resulting semiconductor device 200 is illustrated in FIG. 15. Semiconductor device 200 may also be operated as an IGBT or MOSFET, depending on whether a pn-junction 14 is formed between semiconductor regions 31, 32 or not.

The explained self-aligned process allows reducing process variations. Accordingly, the vertical extension of the trench structures may be reduced. Thus device capacitances and switching losses may be reduced.

The method for forming semiconductor device 200 may also be described as providing a semiconductor arrangement with a semiconductor body 110 having a first surface 101 and at least one trench 150 extending from the first surface 101 into the semiconductor body 110. The at least one trench 150 includes a gate electrode 1 which is insulated from the semiconductor body 110 and arranged below the first surface 101. An insulation layer 6 is deposited on the first surface 102 and the gate electrode so that the insulation layer 6 has a recess 61 that is, in a projection onto the first surface 101, completely arranged within the trench 150. Typically, the at least one trench 150 is at least completely filled after depositing the insulation layer 6. In the recess 61 a mask region 7 is formed. Forming the mask region 7 includes depositing a dielectric material on the insulation layer 6 and plasma etching the dielectric material using the insulation layer 6 as etch-stop.

Typically, the provided semiconductor arrangement includes an insulated field electrode 2 in a lower portion of the at least one trench 150. A gate dielectric region 5c is formed such that the gate dielectric region at least lines side walls of the at least one trench 150 in an upper portion. Forming the gate electrode 1 typically includes depositing a conductive material on the insulated field electrode 2 in the at least one trench 150.

Furthermore, a self-aligned contact is formed to a source region 3, an emitter region 3 and/or a body region 4 arranged in a semiconductor mesa next to the at least one trench 150. Forming the self-aligned contact typically includes depositing a third insulation layer 8 on the first surface 101 and anisotropic etching of the third insulation layer 8 to expose the semiconductor mesa and to form an insulation structure 60 arranged on the gate electrode 1 and extending above the first surface 101. The insulation structure 60 may be used to form shallow contact trenches 160 into the semiconductor body 110 or surface contacts on the first surface 101 in a self-aligned manner.

Typically, the insulation structure 60 includes a silicon oxide layer 6, 8 adjoining an upper surface of the gate electrode 1, extending above the first surface 101 and having a recess 61 which is completely arranged within the gate electrode 1 when seen from above. Furthermore, the insulation structure 60 typically includes a silicon nitride region 7 arranged in the recess 61 and between the silicon oxide layer 6, 8 and the first metallization 10.

According to an embodiment, the silicon oxide layer 6, 8 includes a first silicon oxide region 6 made of TEOS or a HDP-oxide, and, a second silicon oxide region 8 arranged between the first silicon oxide region 6 and the first metallization 10 and made of at least one of TEOS, USG and a doped oxide layer.

According to an embodiment, the field effect semiconductor device 200 includes a semiconductor body 110 having a first surface 101 defining a vertical direction and at least one trench 150 extending from the first surface 101 in the semiconductor body 110. The at least one trench 15 includes a gate electrode 1 arranged in an upper portion and below the first surface 101. A first metallization 10 is arranged on the first surface and in electric contact with the semiconductor body 110. An insulation structure 60 is arranged between the gate electrode 1 and the first metallization 10. The insulation structure 60 includes a silicon oxide layer 6, 8 adjoining an upper surface of the gate electrode, extending above the first surface 101 and comprising a recess which is completely arranged within the gate electrode 1 when seen from above. The insulation structure 60 further includes a silicon nitride region 7 arranged in the recess 61 and between the silicon oxide layer 6, 8 and the first metallization 10.

Typically, the insulating structure 60 has, in a vertical cross-section, a width which is about 50 nm to about 100 nm wider than the width of the uppermost portion of the trench 150.

Furthermore, the at least one trench 150 further includes in a lower portion a field electrode 2 which is insulated from the semiconductor body 110 and the gate electrode 1.

The insulation structure 60 of the semiconductor devices 100, 200 illustrated above with regard to FIGS. 8 and 15, respectively, forms an insulation between the gate electrode 1 and the first metallization 10 typically forming a source electrode or a emitter electrode. During producing the semiconductor devices 100, 200, contacts between the first metallization 10 and the mesa adjoining the at least one trench 150 are formed in a self-aligned manner using the insulation structure 60 as a mask. Accordingly, the depth of the vertical trenches and/or the pitch between neighboring trenches 150 may be reduced. Accordingly, both the capacitive properties the field effect semiconductor device 100, 200 may be improved at low on-resistance Ron.

According to an embodiment of a method for producing a semiconductor component, the method includes: providing a semiconductor body with a first surface, forming a trench from the first surface into the semiconductor body, forming a first insulation layer at least on one or more sidewalls of the trench, forming a conductive region in the trench so that the conductive region is insulated from the semiconductor body, forming a second insulation layer on the first surface with a recess that overlaps in projection onto the first surface with the conductive region, and forming a mask region in the recess. Forming the conductive region in the trench includes depositing a conductive material and recessing the trench at the first surface. The method further includes etching the second insulation layer selectively to the mask region and the semiconductor body to expose the semiconductor body at the first surface.

According to an embodiment of a method for producing a semiconductor component, the method includes: providing a semiconductor arrangement with a semiconductor body having a first semiconductor material extending to a first surface and at least one trench extending from the first surface. The at least one trench includes a gate electrode which is insulated from the semiconductor body and arranged next to the first surface. An uppermost portion of the at least one trench is recessed from the first side surface by etching. An insulation layer is deposited on the first surface so that the trench is at least completely filled and that the insulation layer has a recess that is, in a projection onto the first surface, completely arranged within the trench. The recess is filled with a non-crystalline form of the first semiconductor material to form a mask region.

According to an embodiment of a method for producing a semiconductor component, the method includes: providing a semiconductor arrangement with a semiconductor body having a first surface and at least one trench extending from the first surface. The at least one trench includes a gate electrode which is insulated from the semiconductor body and arranged next to the first surface. An uppermost portion of the at least one trench is recessed from the first side surface by etching. An insulation layer is deposited on the first surface so that the trench is at least completely filled and so that the insulation layer has a recess that is, in a projection onto the first surface, completely arranged within the trench. A dielectric material is deposited on the insulation layer and plasma etched using the insulation layer as an etch-stop.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a semiconductor component, the method comprising:
    providing a semiconductor body comprising a first semiconductor material extending to a first surface and at least one trench, the at least one trench extending from the first surface into the semiconductor body, a first insulation layer being arranged in the at least one trench;
    forming a second insulation layer on the first surface comprising a recess that overlaps in a projection onto the first surface with the at least one trench;
    forming a mask region in the recess;
    etching the second insulation layer selectively to the mask region;
    depositing a third insulation layer over the first surface; and
    etching the third insulation layer so that a semiconductor mesa of the semiconductor body arranged next to the at least one trench is exposed at the first surface.

2. The method of claim 1, wherein the at least one trench comprises, in a cross-section substantially orthogonal to the first surface, two side walls; and wherein the second insulation layer is, after etching the second insulation layer and in the projection onto the first surface, arranged within the two side walls.

3. The method of claim 1, wherein the second insulation layer is formed as a TEOS or a HDP-oxide.

4. The method of claim 1, wherein the second insulation layer is mask-less deposited.

5. The method of claim 1, wherein etching the second insulation layer comprises anisotropic etching.

6. The method of claim 1, wherein etching the second insulation layer comprises selective etching the second insulation layer in a process having an etching rate of the second insulation layer that is at least 10 times higher than an etching rate of the mask region.

7. The method of claim 1, wherein forming the mask region comprises at least one of: depositing poly-silicon and a CMP-process.

8. The method of claim 1, wherein forming the mask region comprises at least one of:
    depositing a dielectric material; and
    back etching the dielectric material selective to the second insulation layer.

9. The method of claim 1, wherein the mask region is formed as a nitride.

10. The method of claim 1, wherein the third insulation layer is formed by conformal deposition.

11. The method of claim 1, wherein the third insulation layer is formed as a layer comprised of TEOS, USG or doped silicon oxide.

12. The method of claim 1, wherein etching the third insulation layer comprises anisotropic etching.

13. The method of claim 1, wherein forming the semiconductor component further comprises at least one of:
    forming a field electrode in a lower portion of the at least one trench such that the field electrode is insulated from the semiconductor body by the first insulation layer;
    forming a gate dielectric region such that the gate dielectric region at least lines side walls of the at least one trench in an upper portion; and
    forming in the at least one trench a gate electrode formed by a conductive region arranged on and being insulated from the field electrode.

14. The method of claim 1, further comprising prior to forming the second insulation layer at least one of:
    forming a source region or an emitter region next to the at least one trench and extending to the first surface; and forming a body region next to the at least one trench, the body region forming two pn-junctions with adjoining semiconductor regions within the semiconductor body.

15. The method of claim 14, further comprising at least one of:
    forming a shallow trench in the semiconductor body next to the at least one trench for contacting at least one of the source region, the emitter region and the body region; and
    forming a metallization in electric contact with at least one of the source region, the emitter region and the body region.

16. A method for producing a semiconductor component, the method comprising:
    providing a semiconductor body comprising a first semiconductor material extending to a first surface;
    forming a trench from the first surface into the semiconductor body;
    forming a first insulation layer at least on one or more sidewalk of the trench;
    forming a second insulation layer on the first surface so that the second insulation layer comprises a recess that is; in a projection onto the first surface, completely arranged within the trench; and
    forming a mask region comprising one of:
    filling the recess with a non-crystalline form of the first semiconductor material; and
    depositing a dielectric material on the second insulation layer and etching the dielectric material using the second insulation layer as an etch-stop.

17. The method of claim 16, further comprising anisotropic etching the second insulation layer using the mask region as a mask to expose the semiconductor body at the first surface.

18. The method of claim 17, further comprising forming a contact in a self-aligned manner to at least one of a source region, an emitter region and a body region formed in a semiconductor mesa next to the trench, the method further comprising at least one of:
    depositing a further insulation layer on the first surface and on the mask region;
    anisotropic etching of the further insulation layer to expose the semiconductor mesa and to form an insulation structure arranged in the trench and extending above the first surface; and
    etching a shallow contact trench next to the trench using the insulation structure as a mask.

19. The method of claim 16, wherein the second insulation layer is etched selectively to the mask region and the semiconductor body.

20. The method of claim 16, further comprising forming a conductive region in the trench so that the conductive region is insulated from the semiconductor body.

* * * * *

UNITED STATES PATENT AND TRADEMARK OFFICE
CERTIFICATE OF CORRECTION

PATENT NO. : 9,660,047 B2  Page 1 of 1
APPLICATION NO. : 14/736961
DATED : May 23, 2017
INVENTOR(S) : M. Poelzl It is certified that error appears in the above-identified patent and that said Letters Patent is hereby corrected as shown below:

Column 15, Line 20 (Claim 16, Line 8), please change "sidewalk" to -- side walls --.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*